United States Patent
Horikx et al.

[11] Patent Number: 5,955,837
[45] Date of Patent: Sep. 21, 1999

[54] ELECTROLUMINESCENT ILLUMINATION SYSTEM WITH AN ACTIVE LAYER OF A MEDIUM HAVING LIGHT-SCATTERING PROPERTIES FOR FLAT-PANEL DISPLAY DEVICES

[75] Inventors: Jeroen J. L. Horikx; Coen T. H. F. Liedenbaum; Martinus B. van der Mark; Adrianus J. M. Berntsen; Jeroen J. M. Vleggaar; Henri M. J. Boots, all of Eindhoven, Netherlands

[73] Assignee: U.S. Philips Corporation, New York, N.Y.

[21] Appl. No.: 08/948,473

[22] Filed: Oct. 10, 1997

[30] Foreign Application Priority Data

Oct. 15, 1996 [EP] European Pat. Off. ............. 96202867

[51] Int. Cl.⁶ ..................................................... H01J 1/62
[52] U.S. Cl. ......................... 313/506; 313/509; 313/503; 313/505; 313/489
[58] Field of Search ................................. 313/506, 509, 313/503, 505, 489

[56] References Cited

U.S. PATENT DOCUMENTS

| | | | |
|---|---|---|---|
| 3,074,816 | 1/1963 | Blazek | 313/506 |
| 3,178,580 | 4/1965 | Vogel | 313/506 |
| 3,200,279 | 8/1965 | Westerveld et al. | 313/506 |
| 4,099,091 | 7/1978 | Yamazoe et al. | 313/509 |
| 4,734,618 | 3/1988 | Matsudaira et al. | 313/509 |
| 5,504,389 | 4/1996 | Dickey | 313/506 |
| 5,700,591 | 12/1997 | Okajima et al. | 313/506 |

OTHER PUBLICATIONS

"LEDs" by R. Friend, D. Bradley and A. Holmes in Physics World, Nov. 1992, pp. 42–46.

Primary Examiner—Sandra O'Shea
Assistant Examiner—Ronald E. DelGizzi
Attorney, Agent, or Firm—Steven R. Biren

[57] ABSTRACT

The illumination system (1) has a substrate (2) and an active layer (3) comprising an electroluminescent material, in which the active layer (3) is present between a first, optically transparent electrode layer (5) and a second electrode layer (7). The illumination system (1) is characterized in that a light-scattering layer (28) comprising a medium having light-scattering properties is present in a forward direction (29) with respect to the active layer (3), in which the non-scattered fraction of a (collimated) light beam, when passed through the light-scattering layer (8) in the forward direction (29), is in the range between 0.05 and 0.8, preferably in the range between 0.1 and 0.5. The light-scattering properties of the medium are preferably stronger as the light is more obliquely incident, as is achieved by using birefringent particles and/or media. A very suitable light-scattering layer (28) is a (half) monolayer of $TiO_2$ particles provided on the substrate (2), with an average size of the (spherical) particles of 0.1–1 $\mu$m. The light output of the illumination system (1) is further improved by providing the edges of the substrate (2) with a reflective coating (26).

17 Claims, 3 Drawing Sheets

$n_1 \neq n_2$ $n_1 \neq n_2$ $n_x = n_y = n_2 \neq n_z$ $n_x = n_y = n_1 \neq n_z$ $n_{1x} = n_{1y} = n_{2x} = n_{2y}$
$n_{1z} \neq n_{2z}$

ELECTROLUMINESCENT ILLUMINATION SYSTEM WITH AN ACTIVE LAYER OF A MEDIUM HAVING LIGHT-SCATTERING PROPERTIES FOR FLAT-PANEL DISPLAY DEVICES

BACKGROUND OF THE INVENTION

The invention relates to an illumination system having a substrate and an active layer comprising an electroluminescent material, which active layer is present between a first, optically transparent electrode layer and a second electrode layer.

The invention also relates to a display device of the flat-panel type, comprising such an illumination system.

Electroluminescent illumination systems are used as illumination sources and in, for example, displays and indicator lamps (signaling). Such an illumination system is particularly suitable for use as background lighting for a display device having a liquid crystalline display panel (LCD device), for example, a polymer-dispersed liquid crystal display (PDLCD) device or a plasma-addressed liquid crystal (PALC) display device.

An illumination system of the type described in the opening paragraph is known from, for example, the article: "LEDs" by R. Friend, D. Bradley and A. Holmes in Physics World, November 1992, pp. 42–46. The illumination system described in this article comprises a semiconducting organic polymer film as an active layer which is formed on a first electrode layer which in turn is provided on a glass substrate. A second electrode layer is provided on top of the polymer film. One of the two electrode layers should be optically transparent to transmit light in a direction transverse to the plane of the illumination system. When a voltage is applied across the two electrode layers, the active layer emits light in accordance with an electroluminescence process. The active layer and the two electrode layers jointly constitute a planar light-emitting diode (LED).

The known illumination system has the drawback that the light usable for the formation of an image has a relatively low light output.

SUMMARY OF THE INVENTION

It is, inter alia, an object of the invention to provide an electroluminescent illumination system having an improved light output of light usable for the formation of an image.

To this end, the illumination system according to the invention is characterized in that a light-scattering layer comprising a medium having light-scattering properties is present at the side of the transparent electrode layer facing away from the active layer, in which the non-scattered fraction of a light beam, when passed through the light-scattering layer at an angle transverse to said layer, is in the range between 0.05 and 0.8.

The invention is based on the recognition that only a limited part of the light emitted by the active layer into all directions leaves the illumination system, while the rest of the light (approximately 75%) is captured by (total internal) reflection within (the substrate of) the illumination system. By making use of a light-scattering layer, which scatters the light transmitted through the active layer, the light captured by reflection in the substrate is partly scattered so that, after scattering, the captured light is allowed to leave the illumination system in the desired direction (at an exit face of the illumination system).

In this Application, the term "direct light" is understood to be the light which directly leaves the illumination system at the side of the transparent electrode layer facing away from the active layer, if the illumination system does not have a light-scattering layer. The direction corresponding to the side of the transparent electrode layer facing away from the active layer will hereinafter be referred to as forward direction. The term "captured light" is understood to be the light which cannot leave the illumination system at the side of the transparent electrode layer facing away from the active layer. The captured light is eventually absorbed in the illumination system, or leaves the illumination system at a side (for example, via the edges of the substrate), which is detrimental to the light output. Captured light (in a highly refractive medium) has an angle of incidence with respect to the (normal on the) plane where the direct light leaves the illumination system, which angle is larger than the critical angle corresponding to a change of the refractive index of the material at both sides of the exit face. In other words, total internal reflection occurs for light having an angle of incidence which is larger than the critical angle.

When a light beam is passed through the light-scattering layer, which light beam is directed transversely to the substrate and is substantially parallel (for example, collimated light or light coming from a laser source and being perpendicularly incident on the light-scattering layer), a part of the light is scattered in the light-scattering layer, whereas the other light leaves the light-scattering layer in a direction which has not changed with respect to the angle of incidence. The light output of light usable for the formation of an image is improved if the further conditions of the invention are met, namely, if the non-scattered fraction of the light beam is in the range between $\geq 0.05$ and $\leq 0.8$ (or in the range between $\geq 5\%$ and $\leq 80\%$). When the non-scattered fraction is measured, the absorption, which may occur in the light-scattering layer, and losses occurring due to reflections on the faces where the light enters and leaves the light-scattering layer are corrected. Generally, the light-scattering properties of the light-scattering medium are chosen to be such that the losses due to absorption of light by the light-scattering layer are considerably smaller than the increase of the light output of light usable for the formation of an image in the illumination system, due to the provision of the light-scattering layer.

Due to the presence of the light-scattering layer, both the direct light and the captured light are partly scattered. However, since the direct light covers a shorter path in (the substrate of) the illumination system than the captured light, the risk of scattering of the direct light is smaller than the risk of scattering of the captured light. Moreover, in the known illumination system, the ratio between captured light and direct light is approximately 3:1, so that there is more captured light than direct light and, consequently, the quantity of scattered captured light is larger than the quantity of scattered direct light. The inventors have realized that the sum of the effects of scattering of the direct light and the captured light due to the presence of the light-scattering layer in the illumination system may have both a positive and a negative effect on the total light output of the light from the illumination system usable for the formation of an image and that the (net) effect is positive if the non-scattered fraction of a (collimated) light beam transversely incident on the light-scattering layer is in the range between 0.05 and 0.8 and is sufficiently smaller in the range outside these numbers. The inventors have recognized that an optimum light output of light usable for the formation of an image and transmitted by the illumination system is obtained within said range, and that this maximum is obtained in the range where the non-scattered fraction is between $\geq 0.1$ and $\leq 0.5$.

In a number of experiments with different light-scattering media used as light-scattering layers in an illumination system according to the invention, a relatively flat optimum was found to occur in the light output at a value of about 0.37 of the non-scattered fraction.

The change and the occurrence of an optimum value in the light output of light usable for the formation of an image are determined by the properties of the light-scattering layer (material properties, concentration, particle size, optical properties of the particles), the difference in refractive indices of the materials used and the wavelength (range) of the light used. A number of these aspects will be elucidated, by way of example, in the further description of this Application.

An embodiment of the illumination system according to the invention is characterized in that the substrate comprises the light-scattering medium. Generally, the substrate is present at the side of the illumination system facing away from the active layer, with the direct light leaving the illumination system via the substrate. By adding the light-scattering layer to the substrate, the light output of the illumination system is improved in a simple manner.

An embodiment of the illumination system according to the invention is characterized in that the light-scattering layer is present at a side of the substrate facing away from the active layer. By providing a separate light-scattering layer at the outer side of the substrate and the transparent electrode layer, the properties of the light-scattering layer can be adapted and influenced in a simple manner. The light-scattering layer may alternatively be provided between the transparent electrode layer and the substrate, so that the light-scattering layer is situated close to the active layer.

The effect of the light-scattering layer and hence the light output of the illumination system are improved if the scattering of light in the light-scattering medium is rendered anisotropic in such a way that the probability (per unit of length) of scattering is smaller for the direct light than for the captured light. To this end, a preferred embodiment of the illumination system according to the invention is characterized in that the medium has anisotropic light-scattering properties, with light emitted by the active layer and propagating in the medium in a direction transverse to the active layer being scattered to a smaller extent than light propagating in the medium in other directions. For example, if the light-scattering particles do not have a spherical shape and if a longitudinal axis of the aspherical particles is directed in a direction transverse to (the surface of) the active layer, i.e. the longitudinal axis of the aspherical particles in the light-scattering layer corresponds to the (main) direction in which the direct light is emitted. The direct light is thereby even less likely to be scattered, whereas the captured light is more likely to be scattered.

A further preferred embodiment of the illumination system according to the invention is characterized in that the medium comprises particles which scatter light, in which a component ($n_z$) of the refractive index of the particles in the direction transverse to the active layer differs from the other components ($n_x, n_y$) of the refractive index of the particles. The effect of the light-scattering layer and hence the light output of the illumination system are improved if directed birefringent particles are used in a (non-birefringent) medium.

A further preferred embodiment of the illumination system according to the invention is characterized in that the medium comprises particles which scatter light, in which a component ($n_z$) of the refractive index of the medium in the direction transverse to the active layer differs from the other components ($n_x, n_y$) of the refractive index of the medium. The effect of the light-scattering layer and hence the light output of the illumination system are improved if (non-birefringent) particles are used in a birefringent medium. The properties of the light-scattering layer are further improved by using a suitable combination of birefringent particles in a birefringent layer.

The light-scattering layer preferably comprises two components having different refractive indices, in which the refractive index difference between the two components is larger than $\geq 0.05$. If the difference between the refractive indices of the components is larger than $\geq 0.05$, preferably larger than $\geq 0.1$, the influence of the light-scattering layer on the light output of the illumination system is improved.

These and other aspects of the invention are apparent from and will be elucidated with reference to the embodiments described hereinafter.

BRIEF DESCRIPTION OF THE DRAWING

In the drawings.

The Figures are diagrammatic and not to scale. For the sake of clarity, some dimensions are greatly exaggerated. Similar components in the Figures are denoted as much as possible by the same reference numerals.

DESCRIPTION OF THE PREFERRED EMBODIMENTS

Figure 1A:
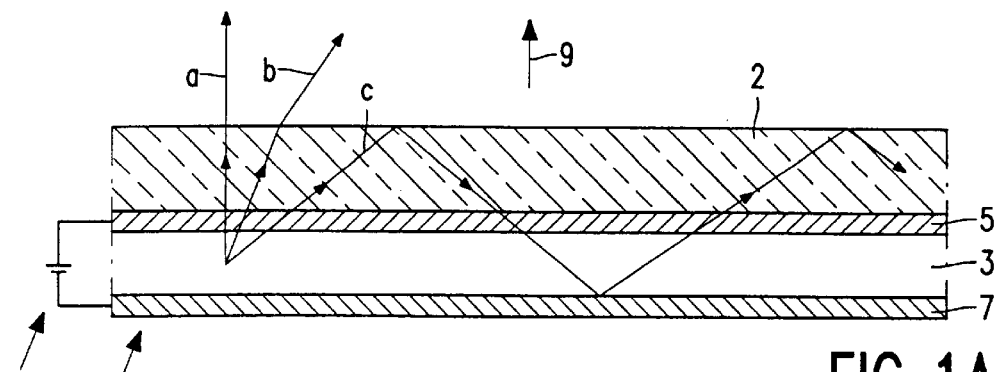
FIG. 1A is a cross-section of an embodiment of a state-of-the-art illumination system.

FIG. 1A is a diagrammatic cross-section of a state-of-the-art electroluminescent illumination system 1 which comprises a substrate 2 and an optically active layer 3 of electroluminescent material. The layer 3 is surrounded by two electrode layers 5, 7. One of the electrode layers, layer 5 in the example of FIG. 1A, is optically transparent. This electrode layer 5 ensures the injection of holes into the layer 3 of active material and is referred to as the anode. Suitable material for this electrode layer 5 is, for example, indium tin oxide (ITO) or a transparent electrically conducting polymer layer such as polyaniline (PANI) or a combination of these materials. The other electrode layer 7, which is referred to as the cathode, is usually reflective and ensures the injection of electrons into the active layer 3. The cathode consists of, for example, calcium, indium, aluminum, barium or magnesium.

When an electric voltage is applied across the two electrode layers 5, 7 by means of a voltage source 6, holes and electrons are injected into the active layer 3 where they will recombine and as a result of which the molecules of this layer 3 will reach a higher energy level. When a molecule falls back to a lower energy level, this energy is released in the form of light. This process is known as electroluminescence. Electroluminescence also occurs in electroluminescent foils (for example, phosphors (for example, ZnS) in a polymer matrix).

Various types of material can be used for the active layer 3. The electroluminescent material may be either an organic or an inorganic material. The use of inorganic materials such as, for example III–V or II–VI semiconductors or phosphors for the active layer 3 is known per se. Metal chelate complexes such as, for example, 8-hydroxychinoline aluminum and semiconducting organic polymers such as, for example, poly(phenylenevinylene) (PPV) are known as organic materials. These materials may function as an active area in a single layer or in a plurality of layers. The advantage of polymer LEDs is that the illumination system can be implemented in an extremely thin form, namely as a (flexible) film. Moreover, in addition to the first transparent electrode layer 5 and the second electrode layer 7, there may be extra layers to increase the electron and hole injection so that the efficiency of the illumination system is further enhanced.

FIG. 1A shows three possible light rays a, b, c which are produced at an imaginary point in the active layer 3 and are emitted in a direction of the transparent electrode layer 5 remote from the active layer 3, which direction is also referred to as the forward direction 9. Light ray a leaves the illumination system at a perpendicular angle, with the result that light ray a does not change its direction (it goes straight on) when it leaves the system. Light ray b impinges upon the exit face of the illumination system at an angle of incidence and leaves the exit face at an exit angle, while, measured with respect to the normal on the exit face, the exit angle is larger than the angle of incidence (normal refraction which takes place at the interface between a medium having a higher refractive index and a medium having a lower refractive index, for example, the glass/air interface). Light ray c impinges upon the exit face of the illumination system at an angle of incidence which is larger than the critical angle corresponding to the change of the refractive index of the materials at both sides of the exit face, as a result of which total internal reflection occurs, in other words, light ray c reflects at the exit face of the illumination system and the light corresponding to light ray c cannot leave the illumination system.

An estimation of the fraction of the light which is isotropically incident on an exit face of an interface between material having refractive index n and air is given by:

$$\frac{1}{2n^2}$$

If the refractive index of the (substrate) material corresponds to that of glass (n=1.5), it follows that approximately 75% of the light will generally remain captured by total internal reflection in (the substrate of) the illumination system and is thus not available for a contribution to the light output of the illumination system. It is an object of the invention to convert a part of this captured light into direct light, thus improving the light output of the illumination system.

Figure 1B:
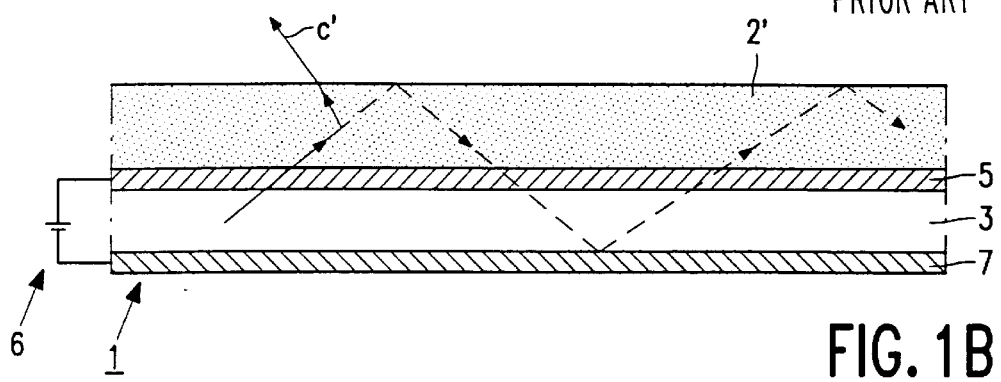
FIG. 1B is a cross-section of an embodiment of the illumination system according to the invention.
Figure 1C:
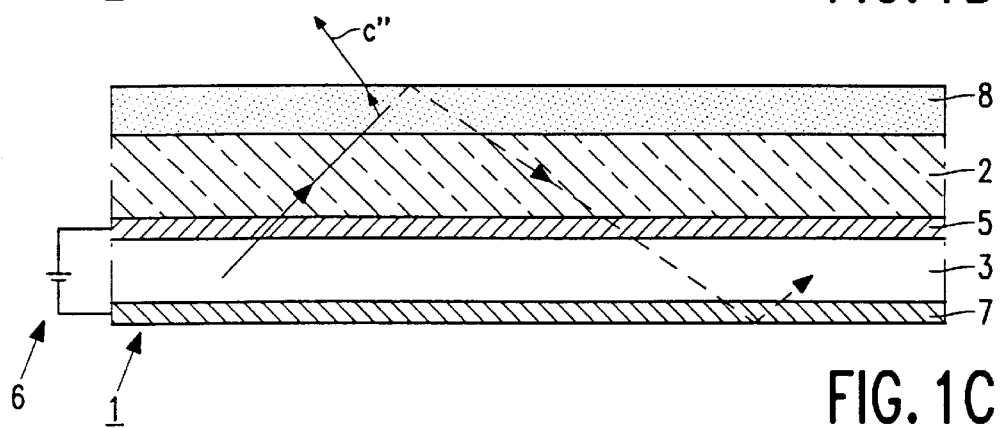
FIG. 1C is a cross-section of an alternative embodiment of the illumination system according to the invention.

In the embodiment of the illumination system 1 according to the invention, shown in FIG. 1B, the substrate 2' comprises a medium having light-scattering properties according to the invention. A light ray c' which is produced at an imaginary point in the active layer 3 and which, without the light-scattering properties of the substrate, would impinge upon the exit face of the illumination system at an angle of incidence which is larger than or equal to the critical angle corresponding to the change of the refractive index of the materials at both sides of the exit face, and as a result of which said light ray would be totally reflected, now has a chance of being scattered on the light-scattering medium in the substrate. As a result of this scattering, the angle of incidence on the exit face can become smaller than the critical angle, so that light ray c' can leave the system. By suitable choice of the properties of the light-scattering medium, such as material properties, concentration and optical properties of the light-scattering medium in the substrate, the light output of the illumination system can be improved considerably. A further measure of improving the light output of the illumination system is to provide a reflecting layer on the edges of the substrate (not shown in FIGS. 1B) so that the chance of scattering the captured light is further increased.

In a preferred embodiment of the illumination system 1 according to the invention, shown in FIG. 1, the substrate 2 is provided with a light-scattering layer 8 comprising a medium having light-scattering properties. A light ray c' produced at an imaginary point in the active layer 3 is thus given the chance of being scattered on the light-scattering medium in the light-scattering layer 8 so that light ray c' can leave the system. Due to the properties of the light-scattering medium in the light-scattering layer 8, the direction of these light rays is "corrected" by the light-scattering medium in such a way that these light rays contribute to the improvement of the light output of the illumination system. A further measure of improving the light output of the illumination system is to provide a reflecting layer on the (side) walls of the substrate (not shown in FIG. 1C) so that the chance of scattering the captured light is further increased.

Figure 1D:
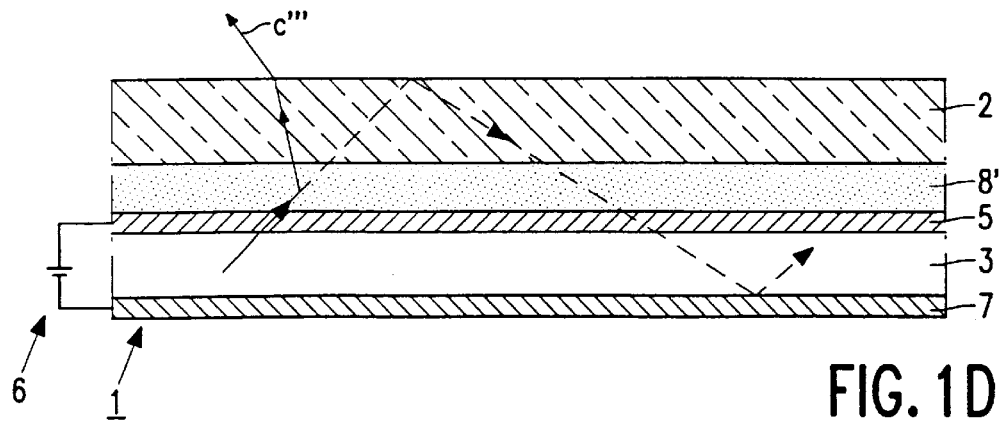
FIG. 1D is a cross-section of an alternative embodiment of the illumination system according to the invention.

In an alternative, preferred embodiment of the illumination system 1 according to the invention, shown in FIG. 1D, a light-scattering layer 8' is present between the substrate 2 and the transparent electrode layer 5, which light-scattering layer 8' comprises a medium having light-scattering properties. It is generally favorable if the light-scattering layer is situated as close to the active layer 3 as possible.

Figure 2A:
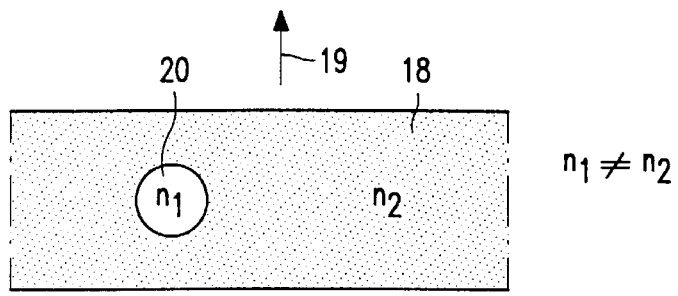
FIGS. 2A to 2E show examples of a light-scattering layer according to the invention, comprising a medium scattering light anisotropically.

The scattering medium may comprise, for example, relatively small, transparent particles having a refractive index $n_1$ which are distributed on a transparent medium having a refractive index $n_2$, in which $n_1 \neq n_2$, or it may comprise a milk-like liquid. FIG. 2A shows a light-scattering layer which comprises particles 20 having a refractive index $n_1$, one of which is shown in FIG. 2A, which particles are distributed on a medium 18 having a refractive index $n_2$ and in which the chance of scattering does not depend on the direction of the incident light ray. The refractive index difference between the medium 18 and the particles 20 is preferably $|n_2-n_1| \geq 0.05$. In an experiment in which, by way of example, (latex) pellets having a diameter d of 3 $\mu$m in glycerol were used as a light-scattering medium, dependent on the layer thickness and the concentration of the (latex) particles in the glycerol, an increase of approximately 35% of the light output of the illumination system was measured with respect to an illumination system without such a light-scattering layer.

Figure 2B:
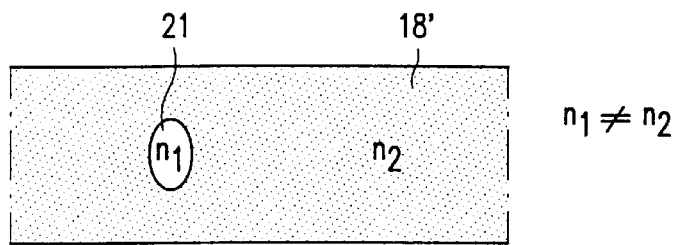
Figure 2C:
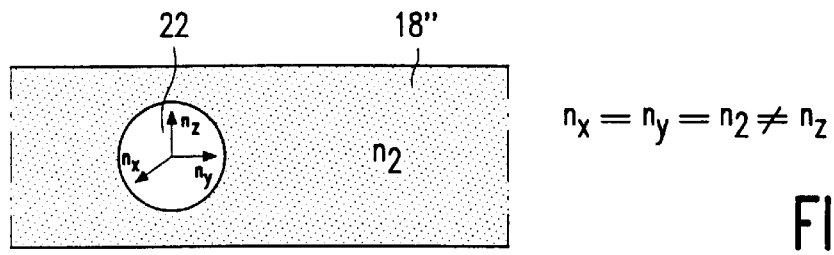

The effect of the scattering layer is considerably improved if the chance of scattering of the light does not depend on the direction of the incident light ray, while it is ensured that the chance (per unit of length) of scattering captured light is greater than of direct light. This is achieved, for example by directing aspherical, scattering particles 21 having a refractive index $n_1$ in a transparent medium 18' having a refractive index $n_2$, in which $n_1 \neq n_2$ (see FIG. 2B). In this case, the direction of the aspherical, scattering particles 21 in FIG. 2B is chosen to be parallel to the forward direction 19. Another way of scattering is shown in FIG. 2C, in which directed, birefringent scattering particles 22 are used in a non-birefringent medium 18". Birefringent is understood to mean that the refractive index of the material is not the same in all directions. In FIG. 2C, the refractive index of the particles 22 has three mutually perpendicular components, namely $n_x$, $n_y$ and $n_z$, in which $n_z$ is at least substantially parallel to the forward direction 19, in which $n_x = n_y \neq n_z$ and in which the refractive index $n_2$ of the medium 18" differs from $n_z$ of the particles 22, in other words, $n_z \neq n_2$. If the light is incident along the z axis, in other words, if it is polarized in the x-y plane, there is no refractive index difference between the particles and the medium and there will be no scattering. If the light passes "obliquely" through the medium (i.e. if it is incident at an angle with respect to the forward direction), a refractive index difference will be produced and scattering will occur.

Figure 2D:
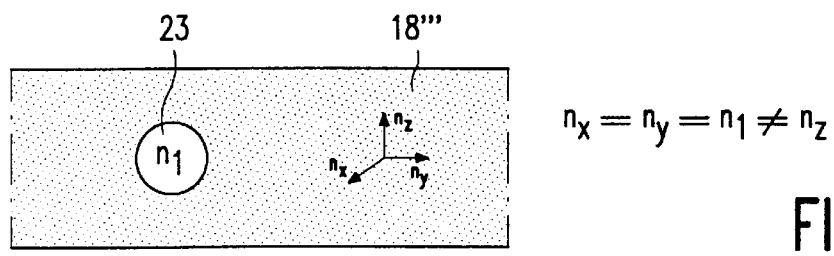
Figure 2E:
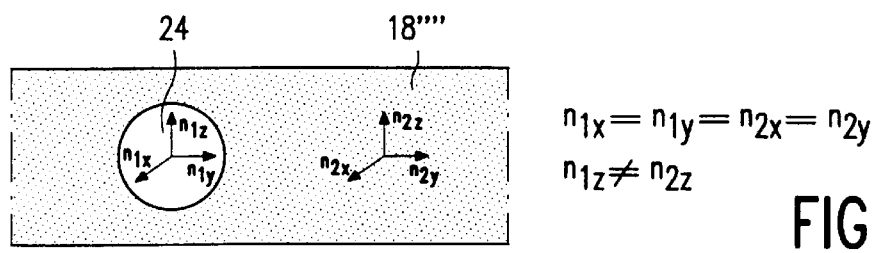

In the example shown in FIG. 2D, non-birefringent particles 23 having an (isotropic) refractive index $n_1$ are incorporated in a birefringent medium 18''' whose refractive index has three mutually perpendicular components, namely $n_x$, $n_y$ and $n_z$, in which $n_z$ is at least substantially parallel to the forward direction 19, $n_x = n_y \neq n_z$ and $n_z \neq n_1$. A further suitable choice of the light-scattering layer comprises birefringent particles 24 having a refractive index with three mutually perpendicular components $n_{1x}$, $n_{1y}$ and $n_{1z}$ in a layer comprising a birefringent medium 18'''' having a refractive index with three mutually perpendicular components $n_{2x}$, $n_{2y}$ and $n_{2z}$, as shown in FIG. 2E.

The particles 20, 21, 22, 23, 24 preferably have an average size (diameter) d of:

$$0.1\lambda \leq d \leq 10\lambda,$$

in which $\lambda$ is the wavelength of the light used (in the case of visible light, with a wavelength $\lambda$ of between 400 and 780 nm, d is in the range between approximately 40 nm and approximately 8 $\mu$m). The average size of the particles is preferably smaller than 2$\lambda$, and the size of the particles is preferably of the order of the wavelength of the light used.

Figure 3:
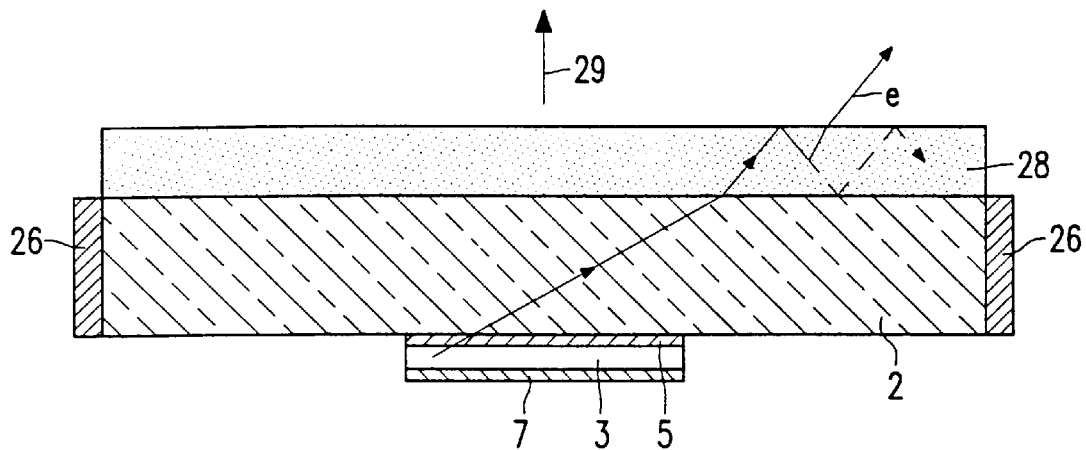
FIG. 3 is a cross-section of an embodiment of the illumination system, provided with a highly refractive, light-scattering layer according to the invention.

The light output of the illumination system may be further improved by providing a layer of a highly refractive material on the substrate. In the example of FIG. 3, a highly refractive, light-scattering layer 28 is provided on a substrate 2, below which an electroluminescent system comprising an active layer 3 and two electrode layers 5, 7 is provided, while the forward direction is indicated by the arrow having reference numeral 29. Suitable highly refractive materials are silicon nitride, tantalum oxide, niobium oxide and titanium oxide. A layer comprising a diamond powder is also used, which material has a high refractive index with respect to the substrate 2. A very suitable material for use as a light-scattering layer 28 is $TiO_2$. At least substantially spherical particles are preferably used, with the average diameter d of the particles being $$0.1\lambda \leq d \leq 10\lambda.$$

Spherical particles are also understood to mean ellipsoid or needle-shaped particles. A very good result is obtained by using a part of a monolayer of highly refractive particles, preferably a monolayer of (at least substantially spherical) $TiO_2$ particles. The average thickness t of the light-scattering layer provided with highly refractive particles is preferably:

$$\tfrac{1}{2}\lambda \leq d \leq 10\lambda.$$

A very suitable layer comprises $TiO_2$ particles having an average size of 0.1 to 1 $\mu$m, preferably between 0.2 and 0.5 $\mu$m. If these particles are provided in a so-called "half monolayer" on the substrate, an improvement of 250% of the light output of light usable for the formation of an image is measured. A half monolayer is understood to mean that approximately half of the substrate is coated with the particles of the material, with the average mutual spacing between the particles approximately corresponding to the average size of the particles (in other words, particles having a size d are spaced apart by a distance d).

A further measure of improving the light output of the illumination system is to provide a reflective layer 26 on the edges of the substrate (see FIG. 3). A light-reflective layer 26 or coating provided on the (side) walls of the substrate 2, which walls are transverse to the forward direction 29, ensures that the captured light cannot leave the substrate 2 at a side but is reflected by the layer 26 so that the light remains in the substrate 2. This increases the chance of scattering the captured light, so that the captured light can as yet contribute to the light usable for the formation of an image. The combination of a light-scattering layer 28 provided on the substrate 2 and a light-reflective coating 26 provided on the edges of the substrate 2 yields a considerable improvement of the light output of light usable for the formation of an image.

Figure 4:
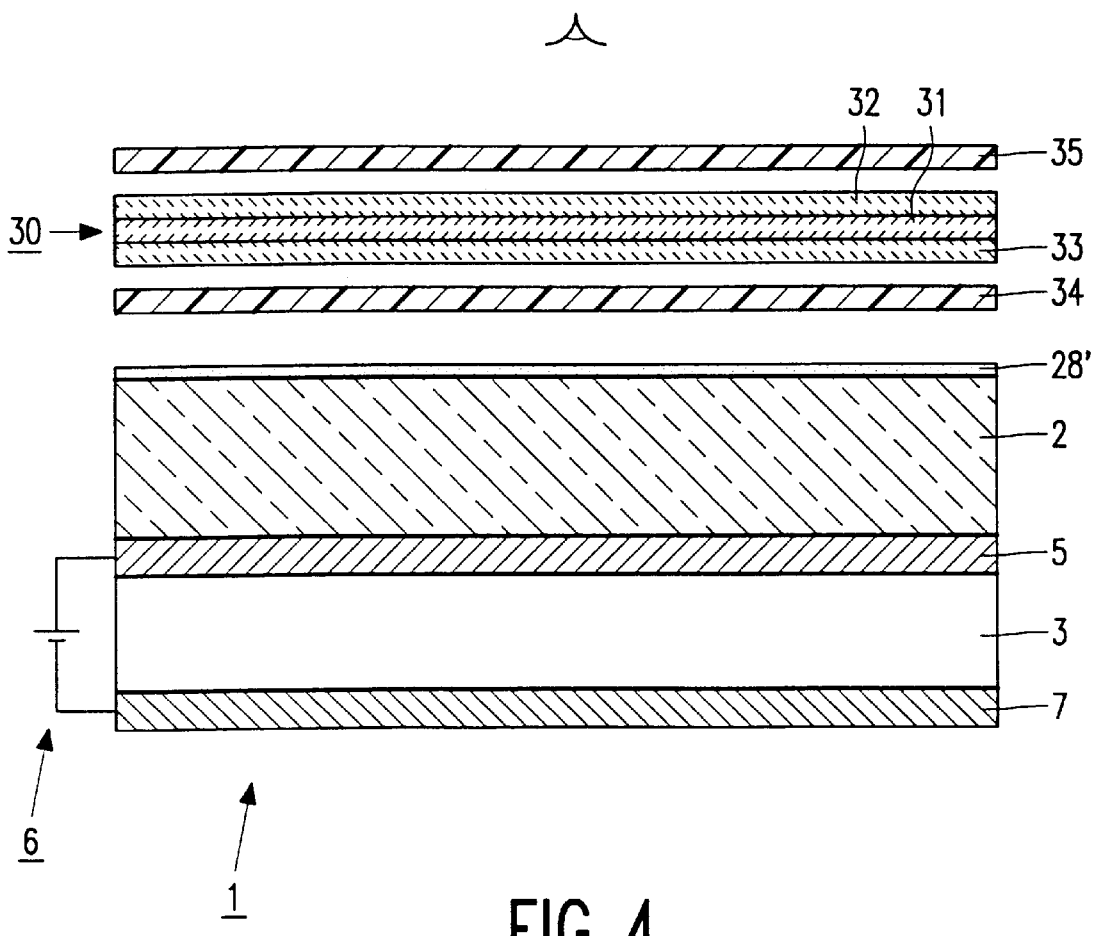
FIG. 4 shows an embodiment of a flat-panel display device provided with an illumination system according to the invention.

FIG. 4 shows very diagrammatically an embodiment of a flat-panel display device provided with an illumination system according to the invention. The light supplied by the illumination system 1 is incident on a display device, in this example a liquid crystal color display device (LCD) having a plurality of liquid crystal cells 30 for displaying colors and comprising a liquid crystal layer 31 between two substrates 32, 33. The electrodes on the substrates 32, 33 are not shown in FIG. 4 and, for the sake of simplicity, only one liquid crystal cell 30 is shown. The device further comprises two polarizers 34, 35. The polarizer 34 may be omitted if the illumination system itself emits polarized light, for example if a layer having a (reflecting) polarizer (not shown in FIG. 4) is present in the illumination system 1 at the side of the transparent electrode layer 5 facing away from the active layer 3. The display device may also be a polymer-dispersed liquid crystal display (PDLCD) device or a plasma-addressed liquid crystal (PALC) display device.

By using an illumination system which is provided with a layer having light-scattering properties according to the invention, a flat-panel display device is obtained with a relatively high light output, because the ratio between direct light and captured light is improved in favor of the direct light by means of scattering and/or reflection of the light.

It will be evident that many variations within the scope of the invention can be conceived by those skilled in the art.

In summary, the invention relates to an illumination system having a substrate and an active layer comprising an electroluminescent material, in which the active layer is present between a first, optically transparent electrode layer and a second electrode layer. The illumination system is characterized in that a light-scattering layer comprising a medium having light-scattering properties is present in a forward direction with respect to the active layer, in which the non-scattered fraction of a (collimated) light beam, when passed through the light-scattering layer in the forward direction (29), is in the range between 0.05 and 0.8, preferably in the range between 0.1 and 0.5. The light-scattering properties of the medium are preferably stronger as the light is more obliquely incident, as is achieved by using birefringent particles and/or media. A very suitable light-scattering layer is a (half) monolayer of $TiO_2$ particles provided on the substrate, with an average size of the (spherical) particles of 0.1–1 μm. The light output of the illumination system is further improved by providing the edges of the substrate with a reflective coating.

What is claimed is:

1. An illumination system (1) comprising a substrate (2) and an active layer (3) comprising an electroluminescent material, said active layer (3) being provided between a first major surface of a first, optically transparent electrode layer (5) and a second electrode layer (7), wherein a light-scattering layer (2', 8, 8', 28, 28') comprising a medium having light-scattering properties is present adjacent a second, opposite major surface of the transparent electrode layer (5), in which a non-scattered fraction of a light beam, when passed through the light-scattering layer (2', 8, 8', 28, 28') at an angle transverse to said layer (2', 8, 8', 28, 28'), is in the range of between about 0.05 and 0.8.

2. An illumination system as claimed in claim 1, wherein the non-scattered fraction is in the range between 0.1 and 0.5.

3. An illumination system as claimed in claim 1, wherein the substrate (2') comprises the light-scattering medium.

4. An illumination system as claimed in claim 1, wherein the light-scattering layer (8) is present at a side of the substrate (2) facing away from the active layer (3).

5. An illumination system as claimed in claim 1, wherein the light-scattering medium has anisotropic light-scattering properties, with light emitted by the active layer (3) and propagating in the light-scattering medium in a direction transverse to the active layer (3) being scattered to a smaller extent than light propagating in the medium in other directions.

6. An illumination system as claimed in claim 5, wherein the light-scattering medium (18') comprises aspherical particles (21), whose longitudinal axis is directed in a direction transverse to the active layer (3).

7. An illumination system as claimed in claim 5, wherein the light-scattering medium (18") comprises particles (22) which scatter light, in which a component ($n_z$) of the refractive index of the particles (22) in the direction transverse to the active layer (3) differs from the other components ($n_x$, $n_y$) of the refractive index of the particles (22).

8. An illumination system as claimed in claim 5, wherein the light-scattering medium (18''') comprises particles (23) which scatter light, in which a component ($n_z$) of the refractive index of the light-scattering medium (18''') in the direction transverse to the active layer differs from the other components ($n_x$, $n_y$) of the refractive index of the light-scattering medium (18''').

9. An illumination system as claimed in claim 1, wherein the light-scattering layer comprises two components having different refractive indices, the refractive index difference between the two components being larger than 0.05.

10. An illumination system as claimed in claim 1, wherein edges of the substrate (2) are provided with a reflective coating (26).

11. An illumination system as claimed in claim 1, wherein the light-scattering medium comprises a compound from the group of silicon nitride, tantalum oxide, niobium oxide and titanium oxide.

12. An illumination system as claimed in claim 11, wherein the material comprises $TiO_2$.

13. An illumination system as claimed in claim 11, wherein the material comprises substantially spherical particles.

14. An illumination system as claimed in claim 13, wherein the particles have an average diameter of between 0.1 μm and 1 μm.

15. An illumination system as claimed in claim 11, wherein the layer comprises a part of a monolayer of the material.

16. An illumination system (1) comprising a substrate (2) and an active layer (3) comprising an electroluminescent material, said active layer (3) being provided between a first major surface of a first, optically transparent electrode layer (5) and a second electrode layer (7), wherein a light-scattering layer (28) comprising a medium having light-scattering properties is present adjacent a second, opposite major surface of the transparent electrode layer (5), and in that minor surfaces of the substrate (2) are provided with a reflective coating (26).

17. A display device of the flat-panel type, comprising an illumination system (1) comprising a substrate (2) and an active layer (3) comprising an electroluminescent material, said active layer (3) being provided between a first major surface of a first, optically transparent electrode layer (5) and a second electrode layer (7), wherein a light-scattering layer (2',8,8',28,28') comprising a medium having light-scattering properties is present adjacent a second, opposite major surface of the transparent electrode layer (5), in which a non-scattered fraction of a light beam, when passed through the light-scattering layer (2',8,8',28,28') at an angle transverse to said layer (2',8,8',28,28'), is in the range of between about 0.05 and 0.8.

* * * * *